United States Patent [19]
Petit et al.

[11] Patent Number: 5,461,346
[45] Date of Patent: Oct. 24, 1995

[54] ATOMIC BEAM RESONATOR HAVING CAVITY COUPLING DEVICE PRODUCING ODD NUMBER OF MODES

[75] Inventors: Pierre H. F. Petit, Gif sur Yvette; Vincent P. Giordano, Palaiseau; Pierre J. C. Cerez, Antony; Claude L. A. Audoin, Chatenay Malabry, all of France

[73] Assignee: Tekelec Airtronic Cites des Bruyeres, Sevres, France

[21] Appl. No.: 302,910

[22] PCT Filed: Mar. 15, 1993

[86] PCT No.: PCT/FR93/00257

§ 371 Date: Nov. 3, 1994

§ 102(e) Date: Nov. 3, 1994

[87] PCT Pub. No.: WO93/19531

PCT Pub. Date: Sep. 30, 1993

[30] Foreign Application Priority Data

Mar. 16, 1992 [FR] France .................................. 92 03103

[51] Int. Cl.$^6$ ...................................... H03L 7/26
[52] U.S. Cl. .................................... 331/94.1; 331/3
[58] Field of Search ........................................ 331/94.1, 3

[56] References Cited

U.S. PATENT DOCUMENTS 3,967,115  6/1976  Kern ......................................... 331/94.1
4,661,782  4/1987  Weidemann ................................ 331/3

FOREIGN PATENT DOCUMENTS 2541047  8/1984  France.
2655807  6/1991  France.

*Primary Examiner*—Siegfried H. Grimm
*Attorney, Agent, or Firm*—Pennie & Edmonds

[57]  ABSTRACT

An atomic beam resonator, particularly a cesium beam resonator, suitable for producing an extremely stable reference frequency. The resonator comprises, arranged in series in the beam direction, a source (1) of the atomic jet (2), a first state selector (3), an interrogating region (4) with a Ramsey-type cavity resonator having two arms (17, 18), a second state selector (5) an atom detector (6) for producing the useful output signal of the resonator, and a device for injecting an interrogation signal into the cavity resonator to generate a microwave interrogation field in each arm of said cavity. Said interrogating region (4) is surrounded by a magnetic shield (10). The resonator is characterized in that the device for injecting microwave energy (25) into the the cavity resonator is a coupling device which forms an odd number of modes in the cavity so that both interrogating regions are of opposite phase and the resonator response is at its lowest at the resonant frequency. Said resonator may be used for frequency stabilization of a quartz oscillator.

10 Claims, 3 Drawing Sheets

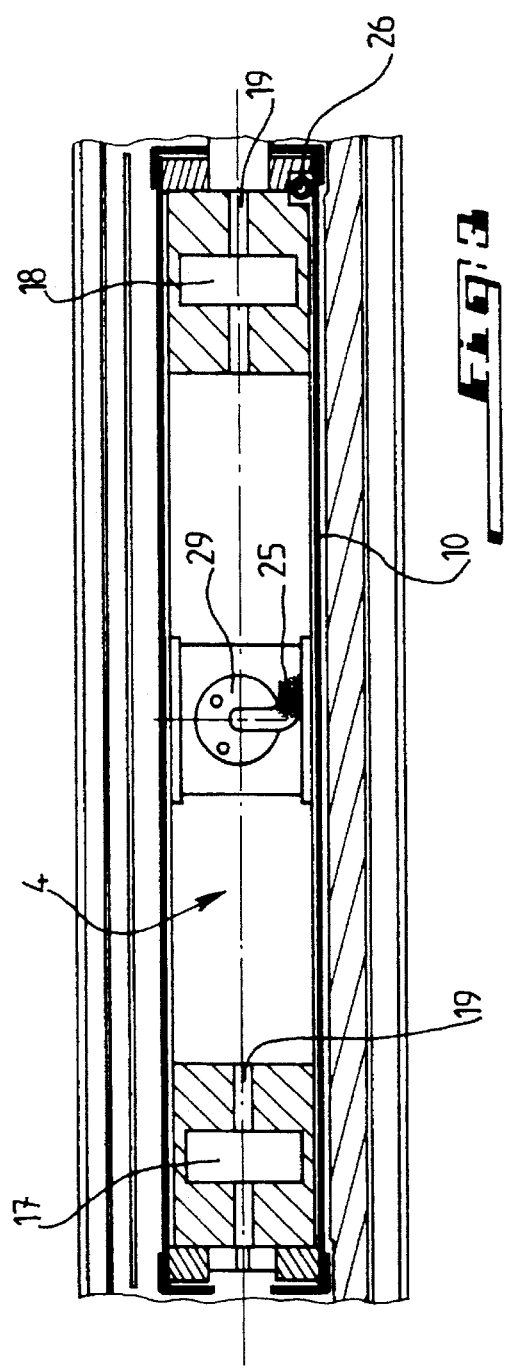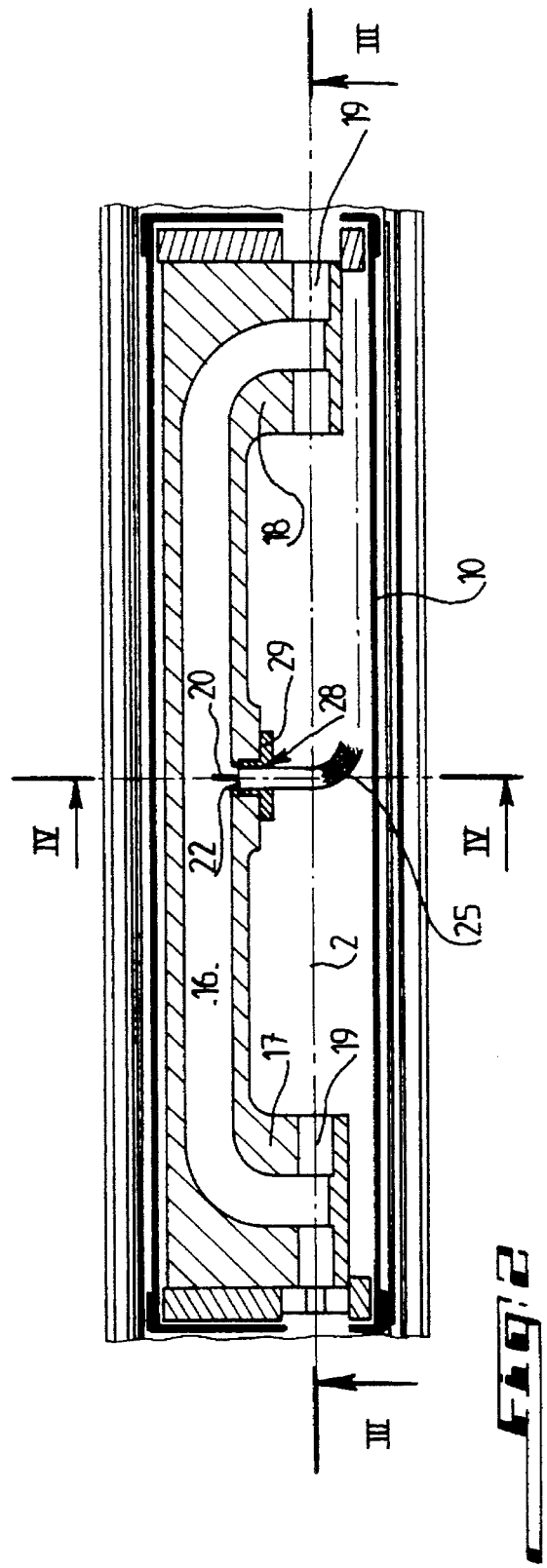

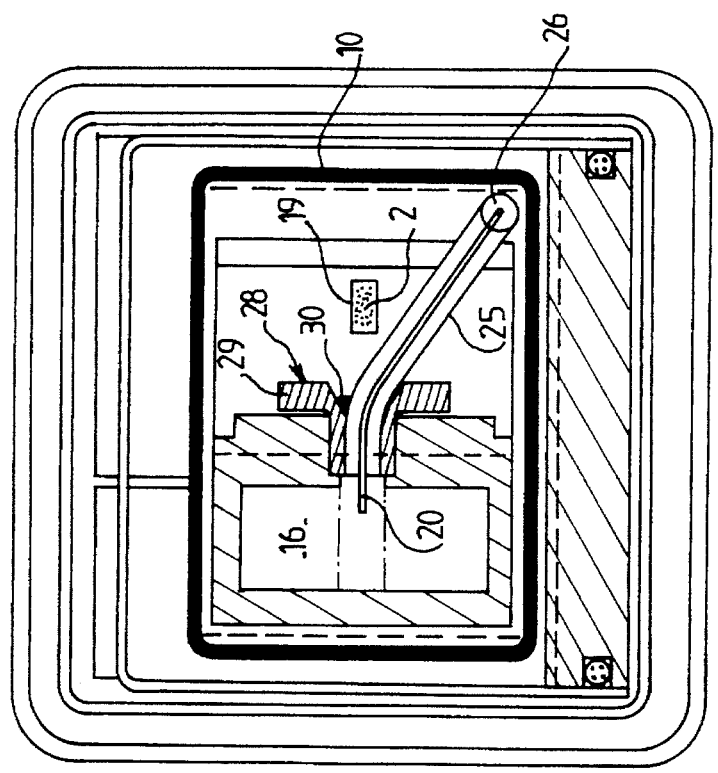
Fig. 4
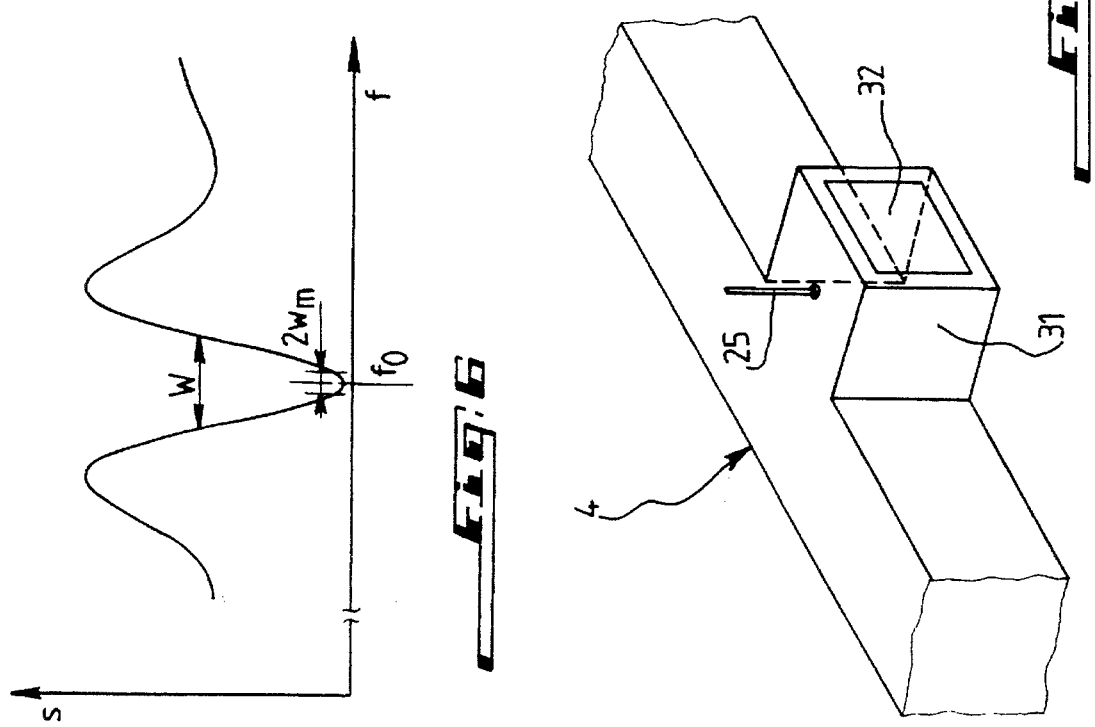
Fig. 5
Fig. 6

5,461,346

ATOMIC BEAM RESONATOR HAVING CAVITY COUPLING DEVICE PRODUCING ODD NUMBER OF MODES

BACKGROUND OF THE INVENTION

The invention relates to an atomic beam resonator, particularly with cesium-beam, advantageously to produce a reference frequency for the frequency stabilization of a quartz oscillator, and comprising, arranged in series in the direction of the beam, an atomic beam source, a first state selector, an interrogating area including a waveguide body constituting a Ramsey-type two arms resonant cavity, the arms of which are transversally traversed by the atomic beam, a second state selector, a photon sensor device for producing the useful output signal of the resonator and a device for injecting into the resonant cavity an interrogating signal produced from the signal from said oscillator, so as to produce in each arm of said cavity a microwave interrogating field interacting with the atomic beam atoms, the interrogating area being surrounded by a magnetic shielding.

Atomic beam resonators of this type are already known. The injection of the microwave energy is usually realized by a magnetic coupling by means of a T-H. In this case, the two microwave interrogating fields are in phase and the response of the resonator exhibits a maximum at the resonance frequency.

These known resonators exhibit important drawbacks from electrical and mechanical points of view. Thus, the coupling through a T-shaped waveguide element renders the resonator cumbersome. This coupling using a waveguide T which must cross the magnetic shielding produces important disturbances of the static magnetic field, which is unfavorable for obtaining good long term frequency stability and good accuracy. Moreover, owing to the fact that the response of the resonator has a maximum at the resonant frequency, the short term frequency stability of the resonator is limited by the shot noise associated with the atomic flux detected at the resonance. On the other hand, for this response of the resonator having a maximum at the resonant frequency, the amplitude of the frequency modulation applied to the interrogating signal must be relatively high, which causes important shiftings of the frequency of the atomic resonance in case for example of an untuning of the cavity.

SUMMARY OF THE INVENTION

The present invention has for purpose to provide an atomic beam resonator which does not have the drawbacks of the technical state, which have just been stated.

To attain this purpose, the resonator according to the invention is characterized in that the injection means of the microwave energy in the resonant cavity is constituted by a coupling device which is adapted to prescribe in the cavity an odd number of modes so that the two interrogating fields are in phase opposition and that the response of the resonator exhibits a minimum at the resonant frequency.

According to a feature of the invention, the coupling device is an electrical coupling-type device.

According to another feature, the electrical coupling device is realized in the form of an antenna extending into the resonant cavity through a passage realized in the wall of the waveguide body so that the axis of the antenna crosses the intersection of the planes of symmetry of the cavity.

According to an advantageous feature of the invention, the antenna is constituted by the central conductor of a coaxial cable an end of which is connected to the generator of the interrogating signal and the other end of which is connected to the waveguide constituting the resonant cavity, and which crosses the shielding sheathing through a hole of small diameter corresponding to the cable diameter and located at a selected location for not disturbing the static magnetic field.

BRIEF DESCRIPTION OF THE DRAWINGS

The invention will be better understood and other purposes, features, details and advantages thereof will appear more clearly during the explanatory description which will follow made in reference to the accompanying schematic drawings given only by way of example illustrating an embodiment of the invention and in which:

The FIG. 1 is a perspective view of an atomic beam resonator according to the present invention, with parts broken away;

Figure 2:
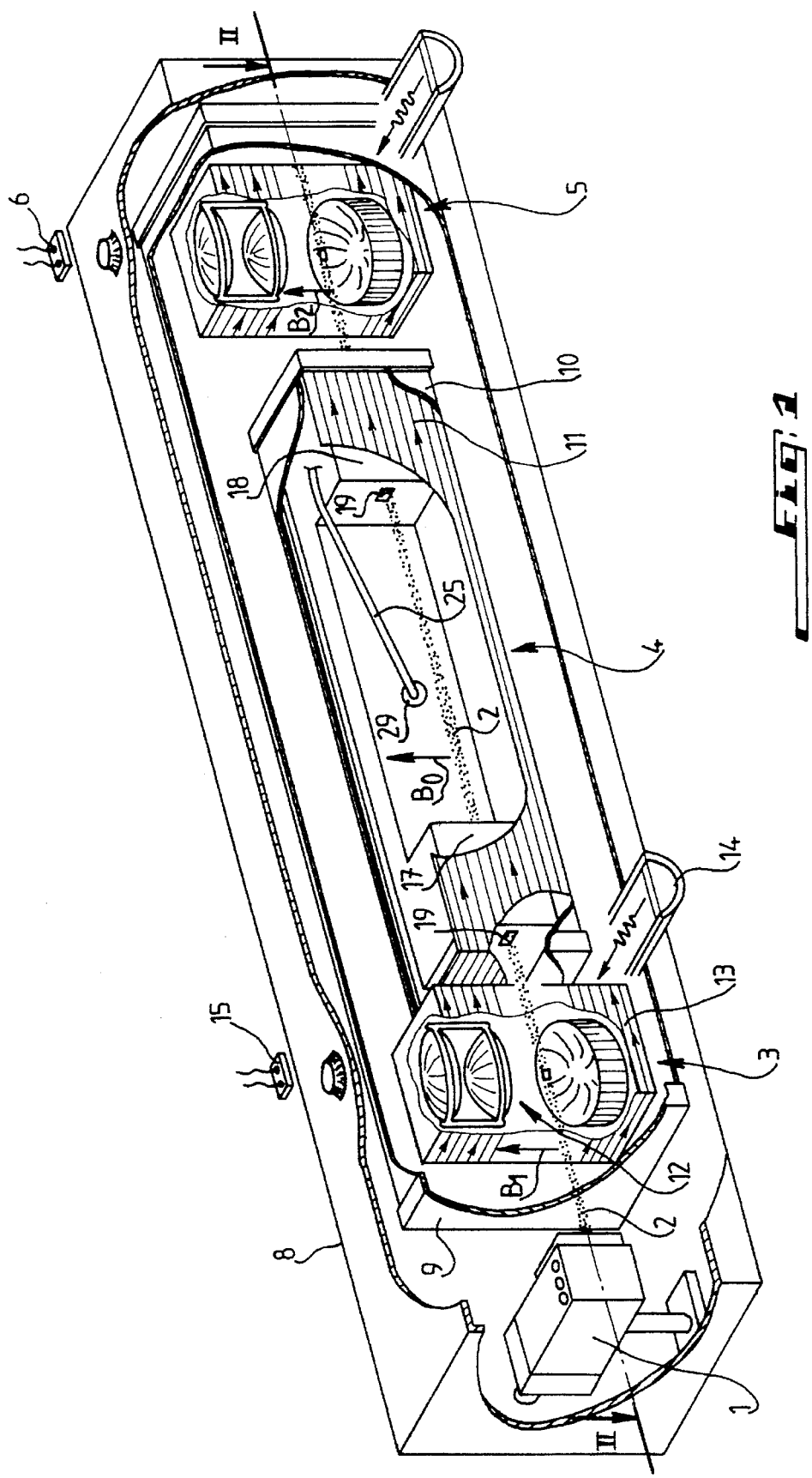

The FIG. 2 is an axial section view according to the line II—II of the FIG. 1, but showing only the interrogating area of the resonator;

The FIG. 3 is a view in the direction of the arrow III of the FIG. 2;

The FIG. 4 is a sectional view according to the line IV—IV of the FIG. 2;

The FIG. 5 shows another version of realization of electrical coupling for the injection of the interrogating energy;

The FIG. 6 illustrates in the form of a curve, the response of the resonator according to the invention.

DETAILED DESCRIPTION OF THE INVENTION

The FIG. 1 shows an atomic beam resonator, in the present case with cesium-beam, for an atomic clock comprising a quartz oscillator (not shown) which is frequency servo-controlled to the resonator output signal serving as reference signal. This reference signal corresponds to the clock transition at 9,192 MHz between the two hyperfine sub-levels of the fundamental state of the cesium atom.

The resonator the general structure of which is known per se comprises essentially an oven 1 constituting the cesium-beam source 2 and, arranged in series in the direction of the beam 2, a first state selector 3, an interrogating area 4, a second state selector 5 and a photodetector 6 intended to sense the photons and to produce the useful output signal of the resonator. The assembly which has just been described, with the exception of the detector 6, is housed in a substantially parallelepiped-shaped casing 8. A first shielding sheathing designated by 9 houses the two state selectors 3 and 5 and the interrogating area 4, the latter being in a specific magnetic shielding sheathing 10. The shielding 10 includes a spool 11 realized in the form of a printed circuit and integrated in the shielding sheathing. This spool has for function to produce a low static magnetic field $B_O$, of about 40 to 60 mG. The field must be very homogeneous and uniform.

In the embodiment of the shown resonator, the state selectors are of laser diode optical pumping-type. Each of the selectors includes an optical system 12 in a spool 13 generating a magnetic field respectively $B_1$ and $B_2$. The laser light is introduced through a port-hole 14. To the state selector 3 is associated a detector 15 which receives the laser light through a detecting porthole and produces a signal used for the stabilization of the laser. The photodetector 6 which produces the resonator output signal is associated with the state selector 5. Of course, the selectors could be also of the magnetic deflection-type, the intersecting areas with the laser being then replaced by state selecting magnets.

The interrogating area 4 is constituted by a metallic body including a Ramsey-type two arms resonance cavity 16. This body exhibits the general shape of a C the two arms 17 and 18 of which are traversed perpendicularly by the cesium beam 2, the beam being oriented parallely to the axis of the base of the C. To allow the passage of the beam, the two arms have appropriate channels indicated by 19. The body 4 is realized in the form of an element delimiting a waveguide cavity curved in the E plane.

A frequency synthesis electronic system (not shown) outputs from the quartz oscillator signal an interrogating signal frequency modulated around 9,192 MHz which is injected into the part of the base of the C of the resonant cavity and causes in the cavity delimited in each of the two arms 17 and 18 a microwave field. In these cavities the atoms of the cesium beam interact with the respective microwave field. The response of the resonator, function of the frequency interrogating signal, appears as a resonant curve inscribed on a continuous background. This latter is due to imperfections of the detecting system. A synchronous demodulation allows to extract an error signal proportional to the frequency shift between the interrogating signal and the atomic transition. This error signal is utilized to stabilize the quartz oscillator frequency. The frequency stability of the atomic transition to the quartz oscillator in the servo-path-band is thus provided.

According to the present invention, to ensure the injection of this energy into the cavity, an electrical coupling is used which is realized by means of an antenna 20 extending into the resonant cavity of the waveguide body, through a hole 22 provided in the internal wall of the base of the C, in the center thereof, so that the axis of this antenna crosses the intersection of the symmetry planes of the cavity. The injection of the interrogating energy through electrical coupling involves the selection of a standard waveguide cavity 16 curved in the E plane and resonating according to an odd number of modes so that the two microwave interrogating fields established in the two arms of the cavity are in phase opposition. The resonator exhibits then the response shown in FIG. 5 which is characterized by a minimum at the resonant frequency $f_o$. This figure shows the amplitude s of the signal as a function of the frequency f of the interrogating signal.

In the shown example, the antenna is constituted by the central conductor of a coaxial cable 25 which is connected at an end to the interrogating signal generator and at its other end to the waveguide body 4, advantageously in the manner shown in detailed fashion in the FIG. 4. This antenna may be also realized by a conductive piece prolongating the central conductor of a coaxial conductor. The coaxial cable crosses the magnetic shielding 10 which protects the interrogating area, through a hole of a small dimension 26. This hole is located near an end of the shielding sheathing. Because of this position of the hole and of its small dimensions, the disturbances of the static magnetic field $B_o$ are minimized. The flexibility of the cable allows the attachment to the waveguide 4 in the available space between the two arms of this body without the atomic beam 2 being disturbed by its presence. As shown in particular by the FIGS. 2 and 3, the cable may be laterally folded up at the level of its attachment to the waveguide and then brought parallely to the wall of the shielding at proximity thereof to the passing hole by being guided between this shielding and the front face of the arm corresponding to the waveguide body.

As shows the FIG. 4, the attachment of the coaxial cable to the waveguide is made through a cylindrical-shaped metallic plug 28 provided with a fixing flange 29 which radially projects outwardly and allows the mounting of the plug on the external surface of the wall of the waveguide through several screws. The coaxial cable is attached in the plug by soldering 30. Other attaching modes of the coaxial cable may be contemplated.

To ensure the rigidity of the fixture of the antenna, it may be put in a dielectric material support which projects into the cavity and could, possibly, bear against the internal backwall of the waveguide.

On FIG. 4, such a rigidifying element of the fixture is illustrated in broken lines and is realized in the form of a dielectric cylindrical element fitted on the central conductor of the coaxial cable. The element could be constituted by a length of the dielectric of the cable.

The FIG. 5 shows another embodiment of the injection of the microwave interrogating energy, through electrical coupling. In this case, the base of the C-shaped waveguide exhibits a parallelepiped-shaped waveguide end 31, which could be open on its front face 32 to allow the injection of the energy. This end could be also closed and the injection could be realized by an antenna, eventually constituted by the central conductor of a coaxial cable attached on the upper surface of the end, as shown in FIG. 5. The internal space of the end could be used to house supplementary devices.

The injection of the interrogating energy by electrical coupling through a coaxial cable provides a multiplicity of considerable advantages. As is apparent from the figures, the injection through a flexible cable, in particular when the latter is attached on the waveguide resonant cavity in the area between the two arms, considerably reduces the cumbersomeness of the assembly and provides to the resonator a very compact structure. As the passage hole of the cable through the shielding exhibits very small dimensions just sufficient to allow the passage of the cable, and owing to the fact that this hole may be provided at an end of the shielding, the magnetic field $B_o$ is very weakly disturbed by the injecting device of the energy in the cavity, which is favorable for obtaining good long term frequency stability and good accuracy. Because of the small dimensions of the passage hole of the cable, the static magnetic field $B_o$ may be produced by a winding realized by a printed circuit with parallel conductive tracks integrated in the sheathing of the shielding, without the necessity of providing particular measures at the level of the conductor to compensate for eventual disturbances, these disturbances being minimized in the case of the invention.

As the response of the resonator, illustrated at FIG. 6, exhibits a minimum at the resonant frequency $f_o$, the atomic flux detected at the resonance is near zero. The shot noise associated with this flux is consequently very low. The short term frequency stability of the clock happens thus to be improved. On the other hand, the amplitude of the necessary frequency modulation $w_m$, applied to the interrogating signal to scan the resonance area may be relatively low because of the low level of the noise. This modulation amplitude $w_m$ is very low with respect to the line width W of the resonant curve. This decreasing of the amplitude of the modulation is favorable to the reduction of some frequency shifts such as the one called "cavity pulling". In the case of the invention, in the presence of an untuning of the resonant cavity, the shift of the atomic resonant frequency tends to cancel out, because of the small value of the amplitude $w_m$.

It is to be noted that many modifications may be made to the invention. In particular, any other type of electrical coupling for the injection of the interrogating energy may be provided to perform the phase opposition of the interrogating fields in the arms of the resonant cavity. It is further to be noted that the invention is usable not only for optical pumping resonators, as shown in the figures, but also for magnetic deflection resonators.

What is claimed is:

1. An atomic beam resonator, in particular with cesium beam, to produce advantageously a reference frequency for the frequency stabilization of a quartz oscillator, and comprising, arranged in series in the direction of the beam, an atomic beam source, a first state selector, an interrogating zone including a waveguide having a Ramsey-type two arms resonant cavity, the arms of which are traversed transversely by the atomic beam, a second state selector, an atom detector device to produce the useful output signal of the resonator, and an injecting device for injection into the resonant cavity of an interrogating signal produced from the signal of said oscillator, so as to produce in each arm of said cavity a microwave interrogating field interacting with the atoms of the atomic beam, the interrogating area being surrounded by a magnetic shielding producing in the internal space a static and homogeneous magnetic field, characterized in that the injecting device of the microwave energy (20, 25) into the resonant cavity (16) is a coupling device which is adapted to produce in the cavity an odd number of modes so that the two interrogating fields are in phase opposition and that the response of the resonator exhibits a minimum at the resonant frequency $f_O$.

2. A resonator according to claim 1, characterized in that the coupling device (20) is an electrical coupling device.

3. A resonator according to claim 2, characterized in that the electrical coupling device is realized in the form of an antenna (20) extending into the resonant cavity (16) through a passage (22) provided in the wall of the waveguide (4) so that the antenna axis crosses the intersection of the symmetry planes of the cavity.

4. A resonator according to claim 3, characterized in that the antenna (20) is constituted by the central conductor of a coaxial cable (25) or its extension an end of which is connected to a source of the interrogating signal and the other end of which is connected to the waveguide (4) with the resonant cavity (16) and which traverses the shielding sheathing (10) through a hole (26) of small diameter correspondingly advantageously to the diameter of the cable (25) and located to a location selected for not disturbing the static magnetic field.

5. A resonator according to claim 4, characterized in that the waveguide (4) is curved in the E plane, resonates according to an odd number of modes, and exhibits the form of a C the arms of which (17) and (18) are traversed by the atomic beam (2) and in that the cable (25) is mounted on the internal wall of the base of the C, which is turned toward the two arms (17) and (18).

6. A resonator according to claim 4, characterized in that the passage hole (26) of the cable (25) through the shielding (10) is located at the level of an end of the shielding.

7. A resonator according claim 1, characterized in that the static magnetic field ($B_O$) of the interrogating area (4) is produced by a spool integrated in the wall of the shielding sheathing and provided advantageously in the form of a printed circuit with substantially parallel conductive tracks.

8. A resonator according to claim 3, characterized in that the end of the antenna (20) which extends into the resonant cavity (16) is maintained by a dielectric material body attached to the interior of the cavity.

9. A resonator according to claim 1, characterized in that the waveguide (4) includes in the central part of the base a lateral waveguide end (31) allowing the injection of the interrogating signal.

10. A resonator according to claim 1, characterized in that the amplitude of a modulation of the interrogating signal in the area around the resonant frequency $f_O$ exhibits a value ($w_m$) which is low with respect to the line width (W) of the curve of the resonator response.

* * * * *